United States Patent
Frulio et al.

(10) Patent No.: US 7,589,572 B2
(45) Date of Patent: Sep. 15, 2009

(54) METHOD AND DEVICE FOR MANAGING A POWER SUPPLY POWER-ON SEQUENCE

(75) Inventors: Massimiliano Frulio, Milan (IT); Stefano Surico, Milan (IT); Andrea Bettini, Cavenago Brianza (IT); Monica Marziani, Arcore (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/611,416

(22) Filed: Dec. 15, 2006

(65) Prior Publication Data

US 2008/0143395 A1 Jun. 19, 2008

(51) Int. Cl.
*H03L 7/00* (2006.01)

(52) U.S. Cl. .................. 327/143; 327/142; 327/198

(58) Field of Classification Search ........... 327/142, 327/143, 198, 333
See application file for complete search history.

(56) References Cited

U.S. PATENT DOCUMENTS

| | | | | |
|---|---|---|---|---|
| 5,323,067 A | * | 6/1994 | Shay | 327/142 |
| 5,485,111 A | * | 1/1996 | Tanimoto | 327/143 |
| 6,528,978 B2 | * | 3/2003 | Lim | 323/313 |
| 6,553,212 B1 | | 4/2003 | Wey | |
| 6,617,833 B1 | | 9/2003 | Xi | |
| 6,617,874 B2 | * | 9/2003 | Uzelac | 326/38 |
| 6,882,213 B2 | * | 4/2005 | Kim | 327/512 |
| 2005/0035796 A1 | * | 2/2005 | Chun et al. | 327/143 |

FOREIGN PATENT DOCUMENTS

WO WO-2008076546 A3 6/2008

OTHER PUBLICATIONS

"International Application Serial No. PCT/US2007/084166 International Search Report mailed May 7, 2008", 2 pgs.
"International Application Serial No. PCT/US2007/084166 Written Opinion mailed May 7, 2008", 6 pgs.

* cited by examiner

*Primary Examiner*—Lincoln Donovan
*Assistant Examiner*—John W Poos
(74) *Attorney, Agent, or Firm*—Schwegman, Lundberg & Woessner P.A.

(57) ABSTRACT

Apparatus, systems, and methods are disclosed that operate to trigger a reference voltage generator from a supply voltage detector, compare an output voltage level from the reference voltage generator with a supply voltage, and to generate an enable signal when the supply voltage is greater than the output voltage level. Additional apparatus, systems, and methods are disclosed.

11 Claims, 3 Drawing Sheets

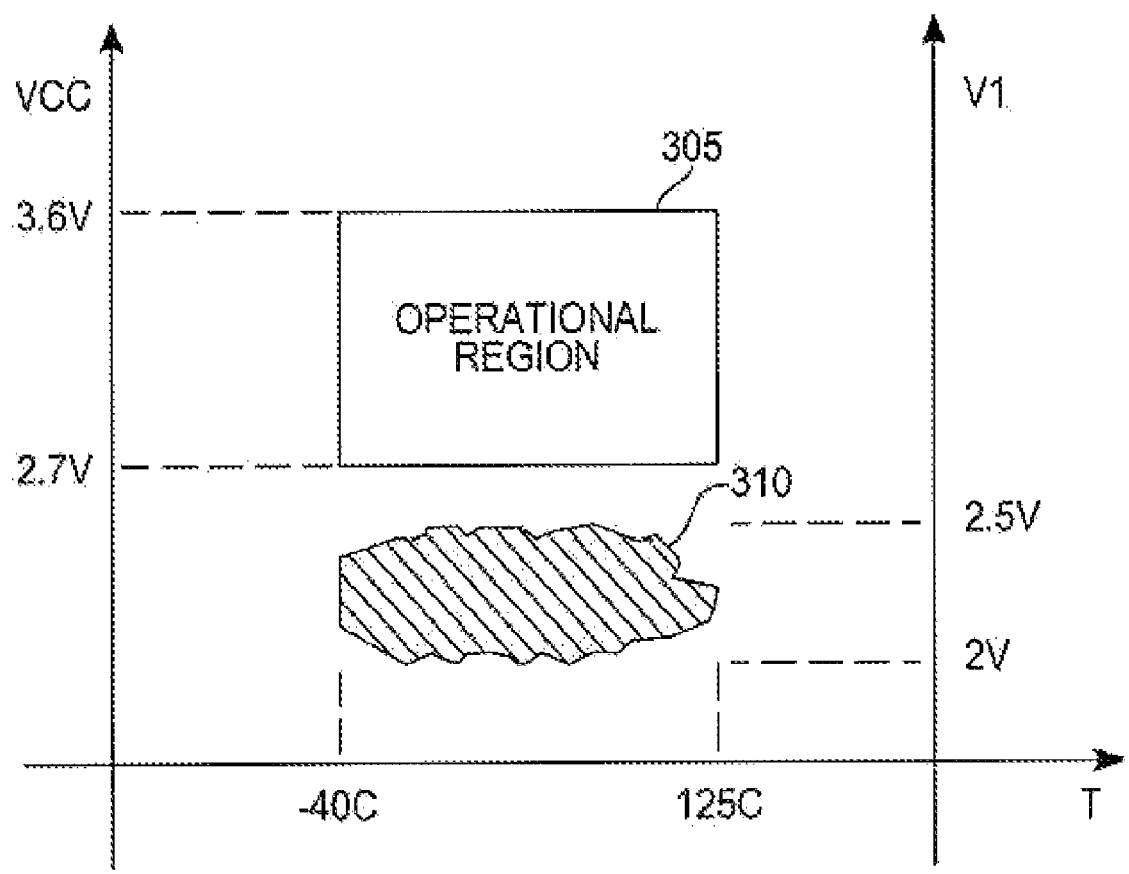
Fig._3 *(Prior Art)*

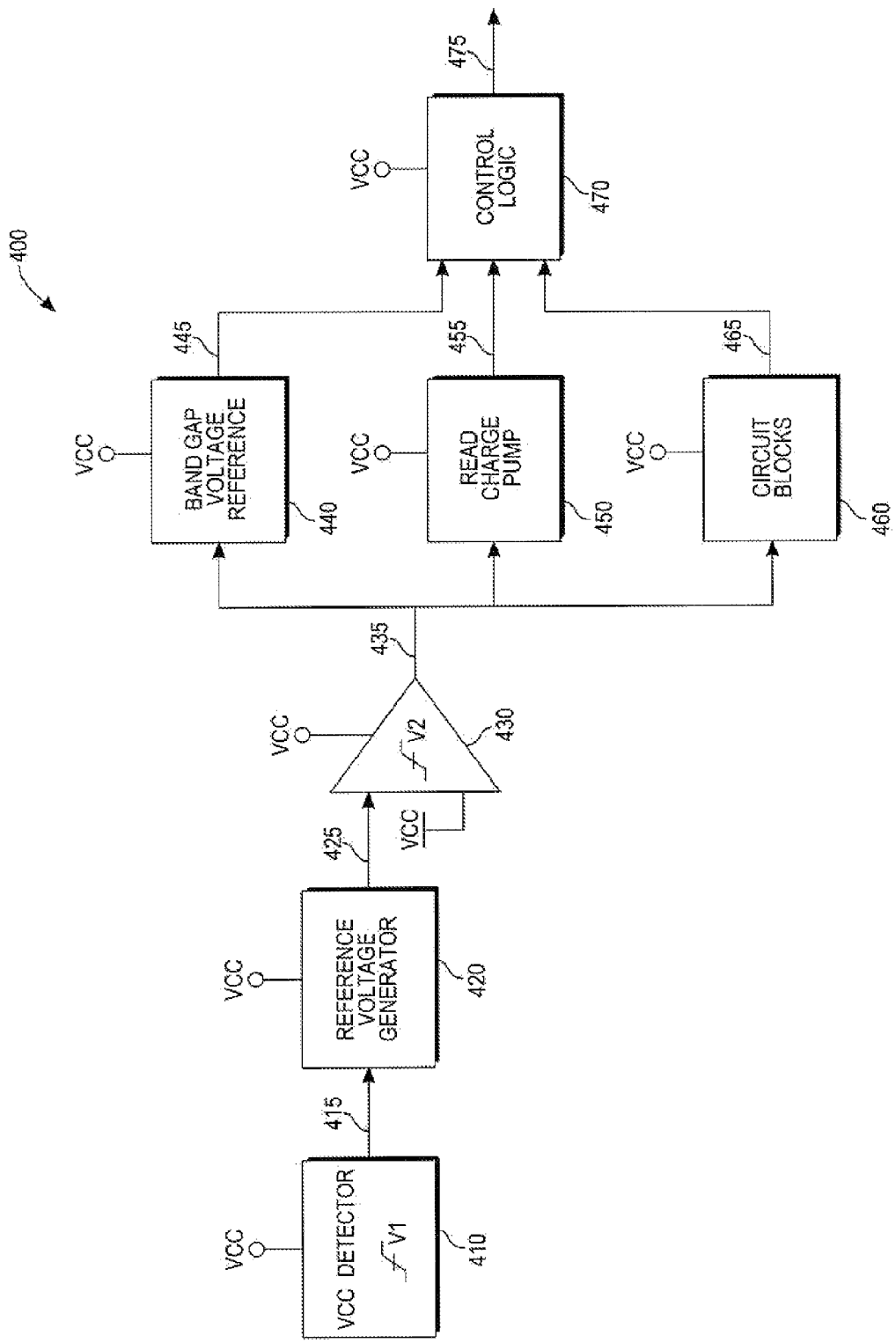
Fig._4

METHOD AND DEVICE FOR MANAGING A POWER SUPPLY POWER-ON SEQUENCE

TECHNICAL FIELD

The present invention relates to electrical power supplies, particularly to a power-on sequence of a power supply.

BACKGROUND ART

Many devices in widespread use today incorporate low-power circuits. In contrast, certain portions of the circuitry within these low-power devices have a requirement for high-voltage functionality. For example, non-volatile memories require voltage levels for reading and programming operations that far exceed a voltage level available from the power supply. Additional circuitry, such as a charge pump, is able to boost electrical charge to a voltage level exceeding that provided by the power supply. In order to perform the voltage boosting function, the charge pump must be supplied with a correct voltage level to operate properly.

Most circuits require a minimum voltage supply level before proper operation may be realized. Without at least a proper minimum power supply voltage level being available, circuitry may perform incorrectly or produce unexpected results. Power-on control circuits have typically used a voltage supply level detector and have compared that level with an internal reference. The internal reference typically has a dependence on internal device thresholds, an ability of accurately tracking electrical characteristics in the device, and on temperature and processing variation.

FIG. 1 is a prior art system block diagram of a device incorporating threshold detection power-on sequencing 100. An output of a VCC detector 110 is connected through a VCC status line 115 to the respective inputs of a bandgap voltage reference 140, a read charge pump, 150, and a circuit block 160. Each one of the bandgap voltage reference 140, the read charge pump, 150, and the circuit block 160, for example, are connected to a VCC power supply terminal to receive power-on voltage according to the comparison power-on sequencing apparatus 100.

An output of the band gap voltage reference 140 is connected through a voltage reference status line 145 to a control logic block 170. An output of the read charge pump 150 is connected through a charge pump status line 155 to the control logic block 170. An output of the circuit block 160 is connected through a circuit block status line 165 to the control logic 170. An output of the control logic block 170 is a control logic status line 175.

At power-on, a ramping-up of the supply voltage level from a VCC power supply exceeds the magnitude of a voltage reference V1 being compared to within the VCC detector 110. The ramping-up supply voltage level triggers production of an enable signal (not shown) on the VCC status line 115 at an output of the VCC detector 110. The enable signal on the VCC status line 115 is provided to the bandgap voltage reference 140, the read charge pump 150, and the circuit block 160. After receipt of the enable signal, the bandgap voltage reference 140, the read charge pump 150, and the circuit block 160 commence operation with a level of VCC being supplied on the VCC terminal that exceeds the voltage reference V1. By appropriate selection of the magnitude of the voltage reference V1, a sufficient level is reached by the ramping-up VCC supply voltage being reached by the ramping-up VCC supply voltage being supplied to the associated circuits so that proper operation is ensured. The bandgap voltage reference 140, the read charge pump 150, and the circuit block 160 are able to successfully carry out their respective processes given enough voltage from the VCC power supply. Each circuit produces an affirmative status signal (not shown) on the bandgap status line 145, the charge pump status line 155, and the circuit block status line 165 respectively.

FIG. 2 is a circuit diagram of a prior art supply voltage detector 200 corresponding to the VCC detector 110 of FIG. 1. An output of a PMOS pull-up transistor 210 is connected through a voltage detection trigger line 215 to a voltage level detector 230. An input of the PMOS pull-up transistor 210 is connected to VCC. A gate input of the PMOS pull-up transistor 210 is connected to ground. An input of the bias resistor 220 is connected to the output of the PMOS pull-up transistor 210 and is connected through the voltage detection trigger line 215 to the voltage level detector 230. An output of the bias resistor 220 is connected to ground. An output of the voltage level detector 230 is connected to a voltage level detection status line 235.

The ramping-up VCC supply voltage level is provided to an input of the PMOS pull-up transistor 210. A full and unqualified level of conduction is possible through the PMOS pull-up transistor 210 with the gate input connected to ground. The ramping-up VCC supply voltage level produces a resultant increasing channel current through the PMOS pull-up transistor 210 which is provided to an input of the bias resistor 220. The increasing current through the bias resistor produces an increasing VCC trigger voltage $VCC_T$ (not shown) on the voltage detection trigger line 215. The increasing VCC trigger voltage $VCC_T$ is compared with the magnitude of the voltage reference V1 within the voltage level detector 230. As the ramping-up VCC supply voltage level exceeds the magnitude of the voltage reference V1, a detection signal (not shown) is asserted on a voltage level detection status line 235 which corresponds to the VCC status line 115 (FIG. 1). When it is determined by comparison within the supply voltage detector 200 that the ramping-up VCC supply voltage level exceeds the magnitude of the voltage reference V1, an enable signal is produced on the voltage level detection status line 235 as an output signal from the voltage level detector 230. Correspondingly, the enable signal is present on the VCC status line 115 of FIG. 1.

With reference to FIG. 3, a voltage vs. temperature diagram of a prior art operational region 305 corresponding to FIGS. 1 and 2. An abscissa (T) of the diagram is a potential temperature range of the device. The device's operational temperature ranges from −40° Celsius (C.) to 125° C. along the abscissa. A left-hand ordinate of the diagram corresponds to the VCC power supply voltage applied to the device. An operational portion of the VCC power supply voltage for the device spans a range from 2.7 volts (V) to 3.6 V. A right-hand ordinate of the diagram is a range of the VCC trigger voltage $VCC_T$. An operational range of the VCC trigger voltage $VCC_T$ is from 2 V to 2.5 V. The area defined by the device's operational temperature range and operational range of the VCC trigger voltage $VCC_T$ is the device's operational region 305.

The VCC trigger voltage $VCC_T$ is highly dependent upon a device threshold voltage of the PMOS pull-up transistor 210 and the precision and linear tracking of electrical characteristics of the bias resistor 220. Variations in fabrication processes and temperature fluctuations affect these device characteristics. These result in variations in device characteristics produce a VCC trigger voltage variation zone 310.

In order to ensure that proper operation occurs within the circuitry being supplied by the VCC power supply, a designer of a system incorporating power-on sequencing 100 crafts the supply voltage detector 200 such that a maximum value of the VCC trigger voltage variation zone 310 is less than the minimum value of VCC in the operational region 305. Unfortunately, with a possible wide span of fluctuation in the VCC trigger voltage variation zone 310, a minimum value for the VCC trigger voltage $VCC_T$ may be too low to supply sufficient voltage and power to properly operate the circuits being supplied by the ramping-up VCC supply.

In the case of a memory cell, the minimum VCC trigger voltage $VCC_T$ may be about 2 volts (i.e., the lower boundary of the VCC trigger voltage variation zone 310). This magnitude of voltage is insufficient to source the read charge pump 130 and the bandgap voltage reference 140 with sufficient power to produce proper operation of these circuits even though affirmative status signals may be produced (but incorrectly) on the charge pump status line 155 and the bandgap status line 145 respectively. As a result, these incorrect status signals are provided to the control logic block 170 and are likely to produce an unpredictable condition in the system due to an incorrect production of the status signaling (not shown) on the control logic status line 175 at the conclusion of the power-on sequence.

It would be desirable to have a capability of producing a stable voltage reference during the ramping-on power sequence that could be used as a basis for determining a sufficient level of the ramping-on VCC voltage. Such a capability would ensure that sufficient power is available to sustain proper operation of the circuitry being supplied and thus eliminate any incorrect status signaling from these devices which would produce erroneous conditions for the system.

SUMMARY

In the present invention, the ramping-up of a supply voltage triggers the generation of a reference voltage, the reference is compared with a continued ramping level of the power supply, and operation of internal circuitry is enabled after the power supply voltage exceeds the reference voltage. The present invention incorporates a supply voltage detector to trigger a reference voltage generator. The reference voltage generator is a temperature and process independent voltage supply capable of operating at low power supply levels. In addition, the reference voltage generator is designed incorporating electrical components with values that accurately track expected electrical characteristics during operation.

An output voltage level from the reference voltage generator is compared with the ramping-up supply voltage. When the ramping-up supply voltage has attained a level greater than he reference voltage generator output voltage level an enable signal is produced. The enable signal is propagated to various system elements and circuitry. The enable signal signifies to the system circuitry that a supply voltage level great enough to support nominal operation is present. Processes undertaken by system circuitry after receipt of the enable signal are assured receipt of sufficient supply voltage to attain a correct completion of their processes.

BRIEF DESCRIPTION OF DRAWINGS

FIG. 3 is a voltage vs. temperature diagram of an operational region corresponding to FIG. 1.

FIG. 4 is a block diagram of a system incorporating a reference comparison power-on sequence controller of the present invention.

DETAILED DESCRIPTION

Figure 1:
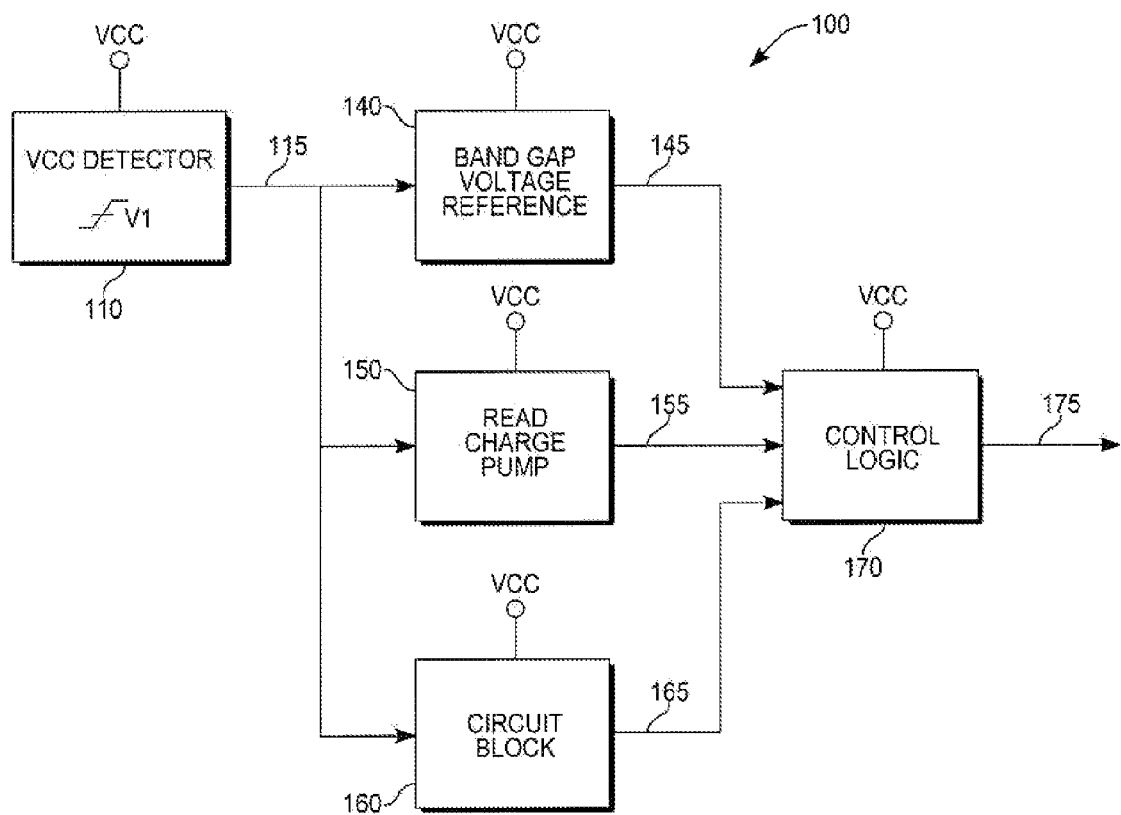
FIG. 1 is a block diagram of a prior art system incorporating power-on sequencing.
Figure 2:
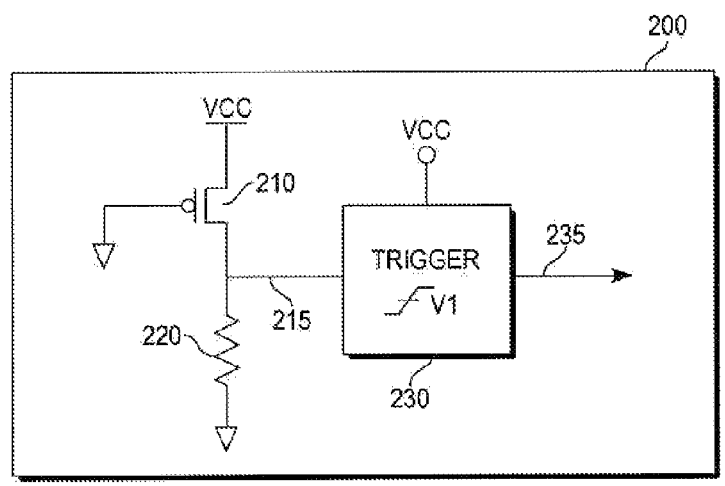
FIG. 2 is a circuit diagram of a prior art supply voltage detector corresponding to FIG. 1.

With reference to FIG. 4, an exemplary reference comparison power-on sequencing apparatus 400 is seen. An output of a VCC detector 410 is connected through a VCC status line 415 to a reference voltage generator 420. An output of the reference voltage generator 420 is connected through a voltage generator status line 425 to a first input of a voltage comparator 430. A VCC power supply terminal connects to a second input of the voltage comparator 430. An output of the voltage comparator 430 is connected through a voltage comparator status line 435 to the respective inputs of a bandgap voltage reference 440, a read charge pump, 450, and a circuit block 460. Each one of the bandgap voltage reference 440, the read charge pump, 450, and the circuit block 460, for example, are connected to a VCC power supply terminal to receive power-on voltage according to the reference comparison power-on sequencing apparatus 400.

A voltage reference has been described as being a bandgap voltage reference source. One skilled in the art would readily conceive of many alternate sources of reference voltage. For instance, a voltage reference may be a buried zener diode, a device incorporating pnp base-emitter temperature coefficient cancellation of differential-diode temperature coefficient, or a collection of shunt or series reference sources to capture a similar cancellation of complementary temperature coefficients, and still readily incorporate the essential characteristics of a stable voltage across temperature and process variation.

An output of the band gap voltage reference 440 is connected through a voltage reference status line 445 to a control logic block 470. An output of the read charge pump 450 is connected through a charge pump status line 455 to the control logic block 470. An output of the circuit block 460 is connected through a circuit block status line 465 to the control logic 470. An output of the control logic block 470 is a control logic status line 475.

At power-on, a ramping-up of the voltage level from a VCC supply voltage exceeds a voltage reference V1 magnitude being compared to within the VCC detector 410. The ramping-up supply voltage level triggers production of an enable signal on the VCC status line 415 at an output of the VCC detector 410. The enable signal on the VCC status line 415 triggers the reference voltage generator 420. A reference voltage (not shown) is produced within the reference voltage generator 420 which is highly stable versus temperature variation and is capable of operation at low levels of VCC power supply voltage. The reference voltage generator 420 is stable versus internal device electrical characteristics such as device thresholds. The reference voltage may be, for example, a bandgap voltage reference source which inherently takes advantage of complementary thermal coefficients of materials generating the current and voltage of the device so that variations in temperature are compensated for and a stable reference voltage is produced.

The reference voltage is provided through the voltage generator status line 425 to the voltage comparator 430 where the reference voltage level is compared with the ramping-up VCC supply voltage level. The voltage comparator 430 may be, for example, a differential analog voltage comparator capable of receiving two analog voltages and producing an output voltage level corresponding to a difference between the levels of the two input voltages. The voltage comparator 430 is capable of operating at low levels of VCC power supply voltage.

While voltage comparison capabilities have been portrayed as an analog voltage comparator, one skilled in the art recognizes that a current sense amplifier incorporated with precision resistors may, due to an ability to accurately amplify small voltages in the presence of large common-mode voltage, for instance, be used for similar functionality. One skilled in the art would readily understand the use of an analog to digital converter with a microcontroller for comparing converted magnitudes of voltages as being the source of an equivalent voltage comparison capability.

After the ramping-up VCC supply voltage level has exceeded the reference voltage, an enable signal is produced by the voltage comparator 430 on the voltage comparator status line 435. The enable signal on the voltage comparator status line 415 is provided to the bandgap voltage reference 440, the read charge pump 450, and the circuit block 460. After receipt of the enable signal, the bandgap voltage reference 440, the read charge pump 450, and the circuit block 460 commence operation with a level of VCC being supplied on the VCC terminal that exceeds the reference voltage generator output level.

By appropriate selection of the magnitude of the reference voltage produced by the reference voltage generator 420, a sufficient level is reached by the ramping-up VCC supply voltage such that proper operation of a plurality circuits being supplied is ensured. The magnitude of the reference voltage is selected to be equal to or greater than the greatest magnitude of VCC power supply voltage necessary to produce proper operation of any of the circuits being supplied. With a sufficient VCC power supply voltage level being supplied, the bandgap voltage reference 440, the read charge pump 450, and the circuit block 460 successfully carry out their respective processes. In turn, each circuit produces respectively, an affirmative status signal on the bandgap status line 445, the charge pump status line 455, and the circuit block status line 465. The affirmative status signals are only produced after a sufficient VCC power supply voltage level has been assured in a manner independent of temperature and process variation.

Each of the respective affirmative status signals is provided to the control logic block 470, which in turn produces an affirmative system status signal on the control logic status line 475. The affirmative system status signal indicates that all internal circuit blocks, supplied with a level of VCC derived from the reference comparison power-on sequence power supply, are working properly.

By only commencing operation in circuit elements drive by the ramping-up VCC supply voltage after this assured level of voltage is attained, will production of correct results produce status signaling indicating a correct result for the power-on sequence. In this way, a system incorporating the power-on sequencing apparatus of the present invention produces a correct status signals from the internal circuit blocks to the control logic block 470. The control logic block 470 in turn produces a valid affirmative system status signal on the control logic status line 475.

What is claimed is:

1. A method comprising:
   determining if a supply voltage level is equal to or greater than a first reference voltage level;
   producing a second reference voltage level if the supply voltage level is equal to or greater than the first reference voltage level;
   producing an enable signal if the supply voltage level is equal to or greater than the second reference voltage level;
   coupling the enable signal to one or more circuits;
   commencing operation of the one or more circuits with the supply voltage level after receiving the enable signal;
   producing an affirmative operation signal from each of the one or more circuits after operation with the supply voltage level has commenced; and
   producing an affirmative system ready signal after receiving all of the affirmative operation signals.

2. The method of claim 1, further comprising producing the second reference voltage level from a plurality of components having counter-acting temperature coefficients to produce the second reference voltage level to be substantially constant during an operating temperature variation.

3. A sequence control device comprising:
   a first voltage detector coupled to receive a supply voltage to generate a triggering voltage level when the supply voltage exceeds a first reference voltage level;
   a voltage generator coupled to the first voltage detector to generate a second reference voltage level upon receiving the triggering voltage level; and
   a second voltage detector coupled to the voltage generator and coupled to receive the supply voltage, an output of the second voltage detector being coupled to a circuit to indicate when the supply voltage is equal to or greater than the second reference voltage level; and
   wherein:
   the second voltage detector is coupled to generate a device initiation signal upon detecting that the supply voltage is equal to or greater than the second reference voltage level; and
   the circuit is coupled to commence operation with the supply voltage upon receiving the device initiation signal.

4. The sequence control device of claim 3, further comprising:
   a control logic block coupled to communicate with the circuit to indicate a successful power-on sequence.

5. The sequence control device of claim 3, wherein the first voltage detector is coupled to generate the triggering voltage level when the supply voltage is equal to or greater than the first reference voltage level.

6. The sequence control device of claim 3, wherein the voltage generator includes components-having counter-acting temperature coefficients to generate the second reference voltage level to remain substantially constant during an operating temperature variation.

7. The sequence control device of claim 3, wherein the circuit includes a plurality of circuits including a bandgap voltage reference, a charge pump, and a circuit block.

8. The sequence control device of claim 3, wherein the second voltage detector is a differential analog voltage comparator.

9. A method comprising:
   determining if a supply voltage is equal to or greater than a first reference voltage;
   producing a second reference voltage using a bandgap voltage reference source if the supply voltage is equal to or greater than the first reference voltage; and
   producing an enable signal if the supply voltage is equal to or greater than the second reference voltage.

10. The method of claim 9, further comprising:
    coupling the enable signal to a circuit; and
    commencing operation of the circuit with the supply voltage after receiving the enable signal.

11. The method of claim 9, further comprising:
    coupling the enable signal to a plurality of circuits;
    commencing operation of each circuit with the supply voltage after receiving the enable signal;
    producing an affirmative operation signal from each of the circuits after operation with the supply voltage has commenced; and
    producing an affirmative system ready signal after receiving all of the affirmative operation signals.

* * * * *

UNITED STATES PATENT AND TRADEMARK OFFICE
CERTIFICATE OF CORRECTION

PATENT NO. : 7,589,572 B2
APPLICATION NO. : 11/611416
DATED : September 15, 2009
INVENTOR(S) : Frulio et al.

It is certified that error appears in the above-identified patent and that said Letters Patent is hereby corrected as shown below:

In column 1, lines 63-64, after "sufficient level is" delete "reached by the ramping-up VCC supply voltage being".

In column 3, line 45, delete "he" and insert -- the --, therefor.

In column 5, line 37, delete "drive" and insert -- driven --, therefor.

In column 6, line 33, in Claim 6, delete "components-having" and insert -- components having --, therefor.

Signed and Sealed this

Fourth Day of May, 2010

David J. Kappos
*Director of the United States Patent and Trademark Office*